(12) United States Patent
Poteet et al.

(10) Patent No.: US 11,629,403 B2
(45) Date of Patent: Apr. 18, 2023

(54) AIR DATA PROBE CORROSION PROTECTION

(71) Applicant: Rosemount Aerospace Inc., Burnsville, MN (US)

(72) Inventors: Steven Poteet, Hamden, CT (US); Marc E. Gage, Feeding Hills, MA (US); Blair A. Smith, South Windsor, CT (US)

(73) Assignee: Rosemount Aerospace Inc., Burnsville, MN (US)

( * ) Notice: Subject to any disclaimer, the term of this patent is extended or adjusted under 35 U.S.C. 154(b) by 626 days.

(21) Appl. No.: 16/165,772

(22) Filed: Oct. 19, 2018

(65) Prior Publication Data
US 2020/0123650 A1    Apr. 23, 2020

(51) Int. Cl.
C23C 16/04    (2006.01)
C23C 16/30    (2006.01)
C23C 16/40    (2006.01)
G01P 13/02    (2006.01)

(52) U.S. Cl.
CPC .......... *C23C 16/045* (2013.01); *C23C 16/303* (2013.01); *C23C 16/402* (2013.01); *C23C 16/403* (2013.01); *C23C 16/405* (2013.01); *G01P 13/025* (2013.01)

(58) Field of Classification Search
CPC ... C23C 16/045; C23C 16/303; C23C 16/402; C23C 16/403; C23C 16/405; C23C 16/45555; C23C 16/40; C23C 16/34; C23C 16/0281; G01P 13/025; G01P 5/165; Y02T 50/60
See application file for complete search history.

(56) References Cited

U.S. PATENT DOCUMENTS 6,134,972 A  * 10/2000 Streckert ............... C23C 14/046
                                                73/861.65
6,617,049 B2 *  9/2003 Darolia ............... C23C 28/3215
                                                416/241 B
7,285,312 B2    10/2007 Li
(Continued)

FOREIGN PATENT DOCUMENTS

CN    108315736 A  *  7/2018    .......... C23C 28/022
EP    0932831 A1      8/1999

OTHER PUBLICATIONS

Machine translation of CN-108315736-A (Year: 2018).*
Extended European search report issued in corresponding EP Application No. 19204261.2, dated Mar. 27, 2020.

*Primary Examiner* — Michael B Cleveland
*Assistant Examiner* — Michael G Miller
(74) *Attorney, Agent, or Firm* — Locke Lord LLP; Daniel J. Fiorello; Gabrielle Gelozin

(57) ABSTRACT

A method can include vapor depositing a corrosion resistant coating to internal and external surfaces of a metallic air data probe. For example, vapor depositing can include using atomic layer deposition (ALD). The method can include placing the metallic air data probe in a vacuum chamber and evacuating the vacuum chamber before using vapor deposition. The corrosion resistant coating can be or include a ceramic coating. In certain embodiments, vapor depositing can include applying a first precursor, then applying a second precursor to the first precursor to form the ceramic coating.

15 Claims, 4 Drawing Sheets

(56) References Cited

U.S. PATENT DOCUMENTS

| | | | |
|---|---|---|---|
| 7,378,310 B1* | 5/2008 | Wang | B82Y 10/00 438/240 |
| 9,772,345 B2 | 9/2017 | Golly et al. | |
| 9,850,573 B1 | 12/2017 | Sun | |
| 10,023,951 B2 | 7/2018 | Shen | |
| 2002/0104481 A1* | 8/2002 | Chiang | C23C 16/483 118/723 I |
| 2004/0104439 A1* | 6/2004 | Haukka | H01L 29/518 257/368 |
| 2004/0194691 A1* | 10/2004 | George | C23C 16/0272 117/84 |
| 2005/0012975 A1* | 1/2005 | George | B81B 3/0005 438/48 |
| 2007/0250142 A1* | 10/2007 | Francis | A61L 31/082 607/116 |
| 2009/0214787 A1* | 8/2009 | Wei | C23C 14/352 427/255.394 |
| 2010/0080957 A1* | 4/2010 | Chinn | B82Y 30/00 428/147 |
| 2010/0124670 A1* | 5/2010 | Tolpygo | C25D 5/34 428/678 |
| 2010/0270508 A1* | 10/2010 | Xu | C23C 16/45553 252/500 |
| 2015/0004319 A1* | 1/2015 | Mizue | C23C 16/403 427/255.34 |

* cited by examiner

AIR DATA PROBE CORROSION PROTECTION

BACKGROUND

1. Field

The present disclosure relates to air data probes, more specifically to corrosion protection for air data probes.

2. Description of Related Art

Air data probes can experience external and internal corrosion, e.g., on aircraft that operate in coastal routes and/or due to sulfur from aircraft exhaust. Certain air data probes can be made of nickel and/or other corrosion resistant material that experiences sporadic temperature fluxes at greater than 1000 degrees F. Contaminants, e.g., sulfur in the atmosphere, accelerate corrosion on nickel leading to sulfidation that penetrates the nickel sheath which can affect heater function. Ceramic coatings have been attempted, but bulk deposition does not provide low porous films as well as internal corrosion protection. In addition, such materials coated on the exterior surface must be resistant to erosive conditions, such as rain, wind, or sand.

Such conventional methods and systems have generally been considered satisfactory for their intended purpose. However, there is still a need in the art for improved air date probe corrosion protection. The present disclosure provides a solution for this need.

SUMMARY

A method can include vapor depositing a corrosion resistant coating to internal and external surfaces of a metallic air data probe. For example, vapor depositing can include using chemical vapor deposition (CVD) or atomic layer deposition (ALD). The method can include placing the metallic air data probe in a vacuum chamber and evacuating the vacuum chamber before using vapor deposition. The corrosion resistant coating can be or include a ceramic coating. In certain embodiments, vapor depositing can include applying a first precursor, then applying a second precursor to the first precursor to form the ceramic coating.

In certain embodiments, the ceramic coating can be an oxide or a nitride. The final film can be either amorphous or crystalline, depending on the material. The first precursor gas can be or come from any volatile compound of: Al, Si, Ti, Zr, Hf, Ta, Nb, Sc, Y, Mg, La, Ce, Pr, W, Ni, Cu, Fe, Cr, Co, Mn, B, Zn, Li, V, Mo, and Sr. The second precursor can be an oxide former including water, ozone, or $O_2$ plasma, or any other suitable compound. For example, the ceramic coating can be silicon dioxide ($SiO_2$), the first precursor can be a reactive, volatile silicon effluent, e.g. dichlorosilane ($SiH_2Cl_2$), and the second precursor can be an oxide former, e.g. ozone ($O_3$).

For example, in certain embodiments, the ceramic coating can be aluminum oxide ($Al_2O_3$), the first precursor can be a reactive, volatile aluminum effluent, e.g. triethyl aluminum, and the second precursor can be an oxide former, e.g. water vapor. Applying the second precursor can include applying heat simultaneously (e.g., about 100 degrees C. for aluminum oxide). In certain embodiments, the ceramic coating can be Tantalum Pentoxide ($Ta_2O_5$) or Zirconium Oxide ($ZrO_2$). Any suitable precursors for any suitable oxides are contemplated herein.

The ceramic coating can be one of titanium nitride (TiN), titanium aluminum nitride (TiAlN), zirconium nitride or tantalum nitride (TaN) (e.g., to provide erosion resistance to the pinhole free coating since oxides may not have sufficient erosion resistance). Certain embodiments can utilize a cationic species (Ti, TiAl, Ta, Zr) with nitride formers of ammonia, plasma assisted ammonia, plasma assisted nitrogen ($N_2$), or hydrazine. In certain embodiments, the first precursor can include a reactive, volatile material, e.g. titanium chloride, and the second precursor can include a nitride former, such as ammonia. Applying the first precursor can include applying heat simultaneously (e.g., about 500 degrees C.).

Any suitable precursors for any suitable nitrides are contemplated herein. Any suitable combination(s) of any oxides and/or nitrides, such as nanolaminate stacks, are contemplated herein.

Vapor deposition can include applying a noble metallic layer to the air data probe before applying the first precursor. Applying the first precursor can include applying the first precursor to the metallic layer.

The metallic layer can include at least one of platinum, Pd, or Ru, e.g., having a thickness between about 5 nm to about 20 nm. Any other suitable metal and/or thickness is contemplated herein. In certain embodiments, the metal can include gold or any other suitable metal. The metal can be applied via vapor deposition if possible, and/or via electroplating or any other suitable method before vapor deposition of other layers.

The corrosion resistant coating can be about 10 nm to about 3 micron thick. Any other suitable overall thickness is contemplated herein.

The metallic air data probe can be or include nickel (e.g., a nickel alloy). Any other suitable material for the air data probe is contemplated herein.

In accordance with at least one aspect of this disclosure, an air data probe can include a metallic body defining internal and external surfaces. The air data probe can include a substantially uniform vapor-deposited corrosion resistant coating disposed on all internal and external surfaces of the metallic body.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
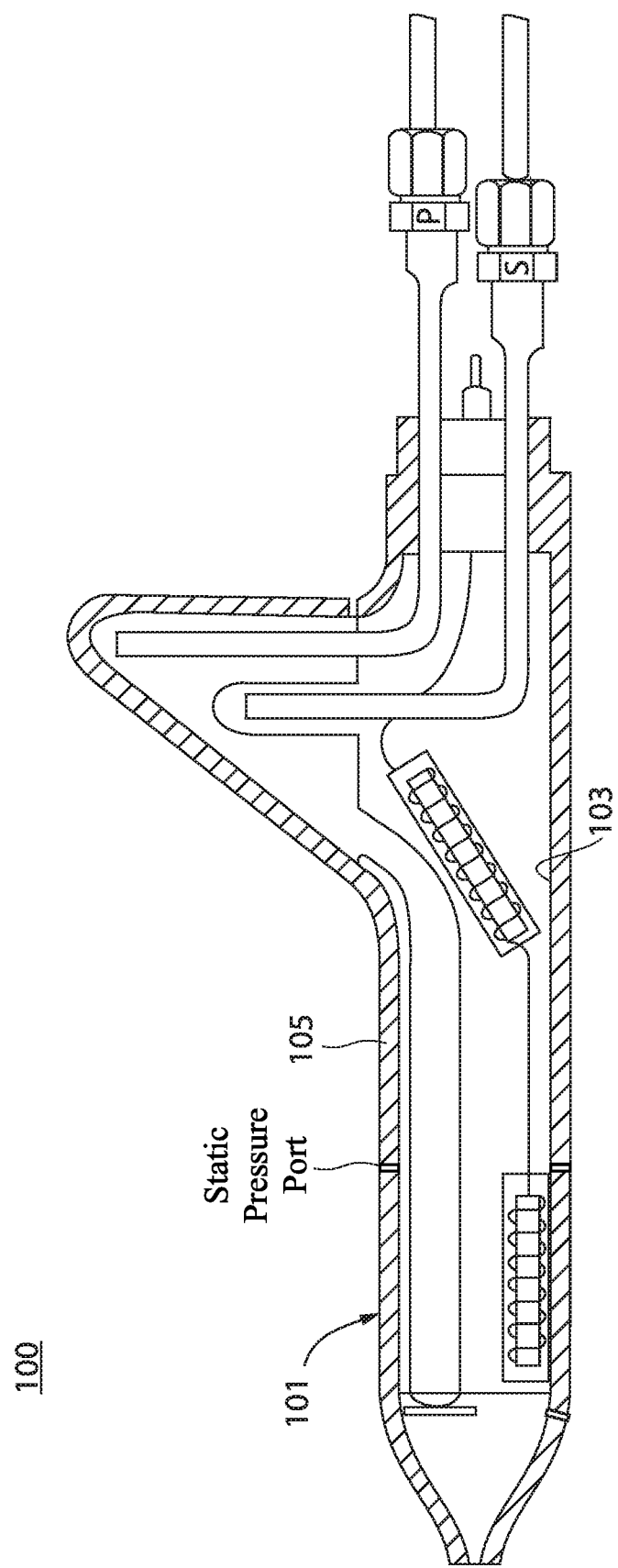
FIG. 1 is a cross-sectional view of an embodiment of an air data probe in accordance with this disclosure.
Figure 2A:
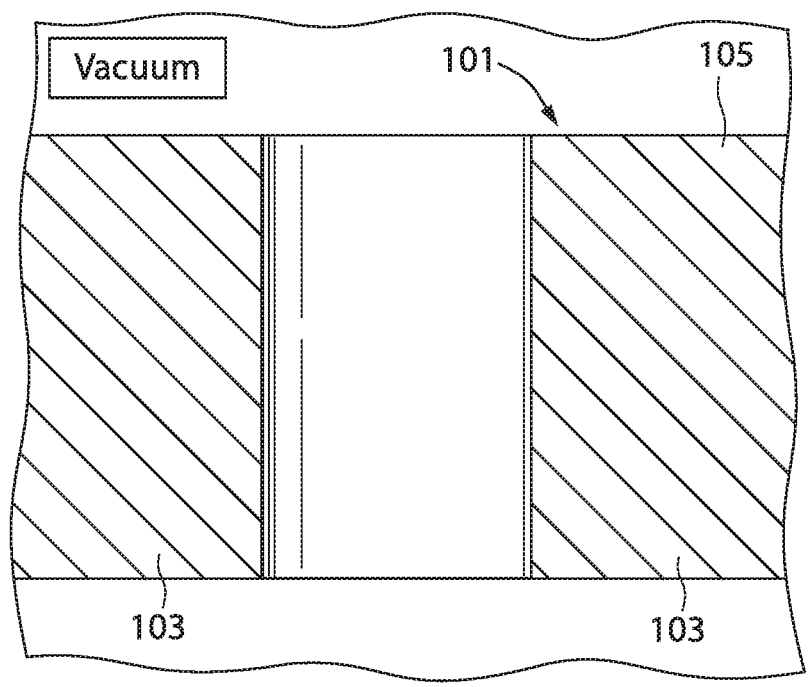
FIGS. 2A-2D show a partial, cross-sectional view of the embodiment of FIG. 1 being coated in accordance with at least one embodiment of a method in accordance with this disclosure.

Reference will now be made to the drawings wherein like reference numerals identify similar structural features or aspects of the subject disclosure. For purposes of explanation and illustration, and not limitation, an illustrative view of an embodiment of an air data probe in accordance with the disclosure is shown in FIG. 1 and is designated generally by reference character 100. Other embodiments and/or aspects of certain embodiments of this disclosure are shown in FIGS. 2A-3. The systems and methods described herein can be used to provide corrosion resistance to one or more air data probes, for example.

In accordance with at least one aspect of this disclosure, referring to FIG. 1, an air data probe 100 can include a metallic body 101 (e.g., a nickel alloy or any other suitable material) defining internal and external surfaces 103, 105. The air data probe 100 can include a substantially uniform vapor-deposited corrosion resistant coating (e.g., as described below and as shown in FIG. 2D) disposed on all internal and external surfaces of the metallic body 101.

A method can include vapor depositing a corrosion resistant coating (e.g., as shown in FIGS. 2A-2D) to internal and external surfaces 103, 105 of a metallic air data probe 100. For example, vapor depositing can include using chemical vapor deposition (CVD) or atomic layer deposition (ALD). Any other suitable type of deposition is contemplated herein.

Referring to FIGS. 2A-2D, a partial cross-sectional view of a portion (e.g., a static pressure port) is shown. In certain embodiments, as shown in FIG. 2A, the method can include placing the metallic air data probe 100 in a vacuum chamber (not shown) and evacuating the vacuum chamber before using vapor deposition.

Figure 2B:
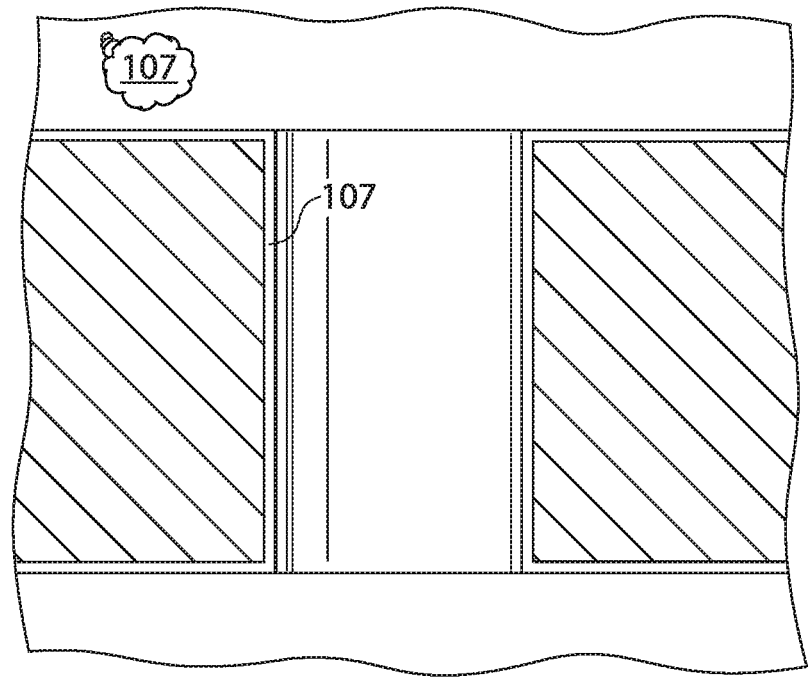
Figure 2C:
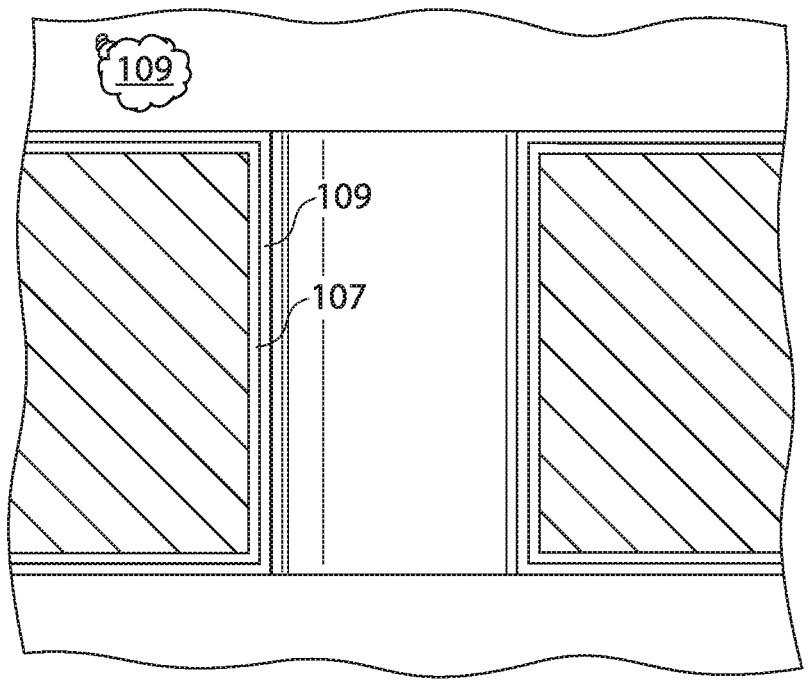
Figure 2D:
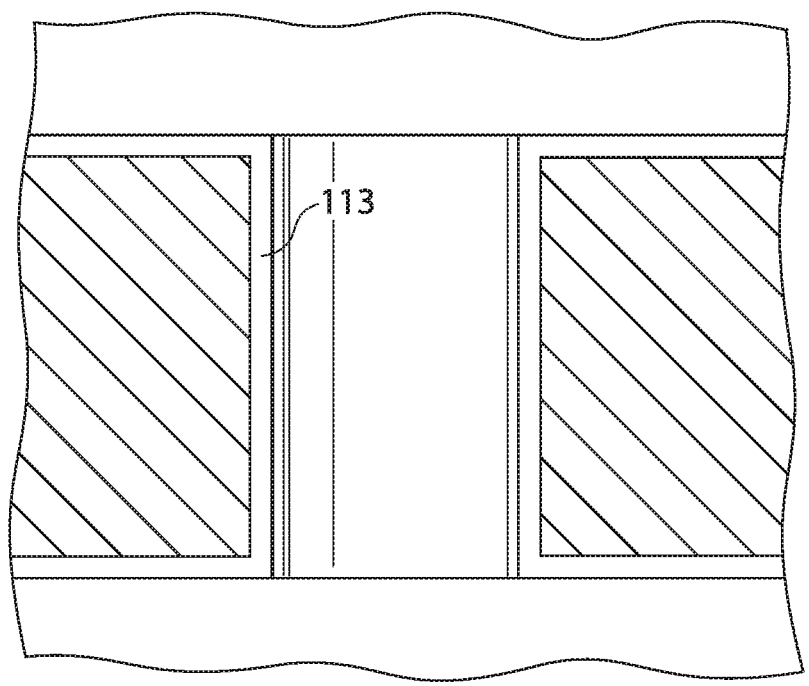
Figure 3:
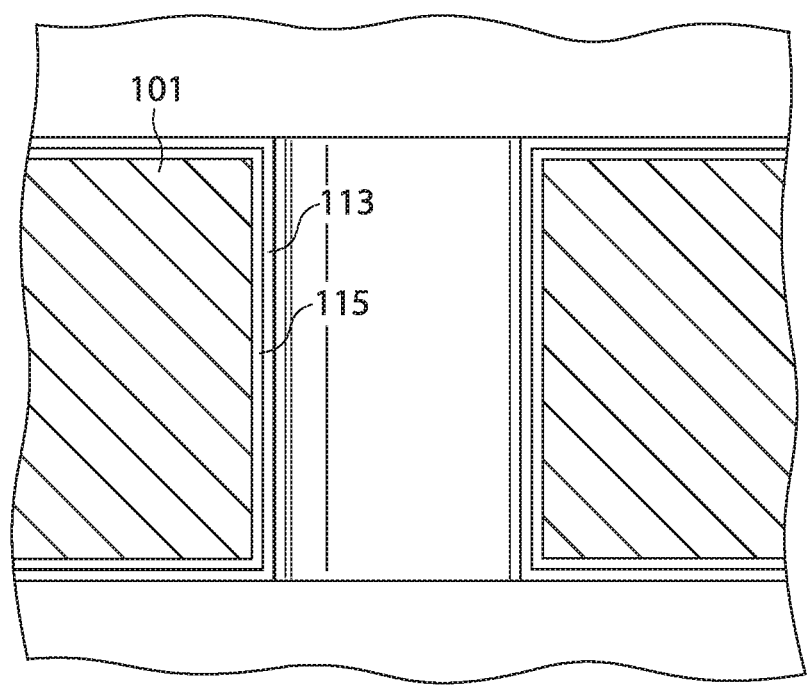
FIG. 3 shows a partial, cross-sectional view of the embodiment of FIG. 1 being coated in accordance with at least one embodiment of a method in accordance with this disclosure, shown having a metallic layer disposed on the body.

In certain embodiments, vapor depositing can include applying a first precursor 107, as shown in FIG. 2B. Vapor depositing can include applying a second precursor 109 to the first precursor 107, e.g., as shown in FIG. 2C, to form at least a first layer of the corrosion resistant coating 113 (e.g., ceramic), e.g., as shown in FIG. 2D. As appreciated by those having ordinary skill in the art in view of this disclosure, the second precursor 109 can be configured to react with the first precursor 107 to form the coating 113.

Applying precursors can be repeated to form a coating 113 of any desired thickness having any suitable number layers with the same and/or different material compositions. Any additional number of precursors to form at least a layer of coating 113 is contemplated herein.

In certain embodiments, the corrosion resistant coating 113, can be or include a ceramic coating. In certain embodiments, the ceramic coating can be an oxide or a nitride. The final film can be either amorphous or crystalline, depending on the material. The first precursor gas can be or come from any volatile compound of: Al, Si, Ti, Zr, Hf, Ta, Nb, Sc, Y, Mg, La, Ce, Pr, W, Ni, Cu, Fe, Cr, Co, Mn, B, Zn, Li, V, Mo, and Sr. The second precursor can be an oxide former including water, ozone, or $O_2$ plasma, or any other suitable compound. For example, the ceramic coating can be silicon dioxide ($SiO_2$), the first precursor can be a reactive, volatile silicon effluent, e.g. dichlorosilane ($SiH_2Cl_2$), and the second precursor can be an oxide former, e.g. ozone ($O_3$).

In certain embodiments, the ceramic coating 113 can be Aluminum Oxide ($Al_2O_3$), the first precursor 107 can be triethyl aluminum, and the second precursor 109 can be water vapor. For such an embodiment and/or for any other suitable embodiments, applying the second precursor 109 can include applying heat simultaneously (e.g., about 100 degrees C. for Aluminum Oxide).

In certain embodiments, the ceramic coating 113 can be Tantalum Pentoxide ($Ta_2O_5$) or Zirconium Oxide ($ZrO_2$). Any suitable precursors for any suitable oxides are contemplated herein.

Any suitable material for the ceramic coating 113 is contemplated herein. For example, the ceramic coating can be or include one or more of Titanium Nitride (TiN), Titanium Aluminum Nitride (TiAlN), or Tantalum Nitride (TaN). Certain embodiments can utilize a cationic species (Ti, TiAl, Ta, Zr) with nitride formers of ammonia, plasma assisted ammonia, plasma assisted nitrogen ($N_2$), or hydrazine.

In certain embodiments, the first precursor 107 can include Titanium chloride and the second precursor 109 can include zirconium nitride. In such embodiments and/or for any other suitable embodiments, applying the first and/or second precursor 107 can include applying heat simultaneously (e.g., about 500 degrees C.). Any suitable precursors for any suitable nitrides are contemplated herein. Any suitable combination(s) of any oxides and/or nitrides are contemplated herein.

Referring to FIG. 3, in certain embodiments, vapor deposition can include applying a metallic layer 115 (e.g., a noble metallic layer) to the air data probe 100 (e.g., directly to the body 101 as shown, or on a coating on the body 101) before applying the first precursor 107. Applying the first precursor 107 can include applying the first precursor to the metallic layer 115. The metallic layer 115 can be applied using vapor deposition or in any other suitable manner (e.g., electroplating).

The metallic layer 115 can include at least one of platinum, Pd, or Ru, e.g., having a thickness between about 5 nm to about 20 nm. Any other suitable metal and/or thickness is contemplated herein. In certain embodiments, the metal can include gold or any other suitable metal. The metal can be applied via vapor deposition if possible, and/or via electroplating or any other suitable method before vapor deposition of other layers. For example, instead of vapor depositing gold, gold can be plated on (e.g., via electroplating or electroless plating), and then additional layers as disclosed herein can be applied with a vapor deposition process (e.g., ALD) to coat the gold and any bare areas not covered by the metal plating process. The thickness of an electroplated layer (e.g., of gold) can be about 3000 nm, or any other suitable thickness.

The corrosion resistant coating 113 can be about 10 nm to about 5 micron thick (e.g., 2 microns). Any other suitable overall thickness is contemplated herein.

The metallic air data probe 100 can be or include nickel or a nickel alloy (e.g., Nickel 201, Inconel 625, 718, X-750). Any other suitable material for the air data probe 100 is contemplated herein.

Embodiments, e.g., utilizing ALD, allow non-line-of-site deposition of materials. In embodiments, a first precursor is deposited and then a second precursor is deposited thereon that reacts with the first precursor to form at least a first layer of a coating 113. Embodiments can be used to substantially uniformly coat complicated internal geometry with very small internal passages of certain air data probes where it was not previously possible. For example, embodiments can provide a coating that is uniform to within about 5 nm to about 10 nm throughout an air data probe.

In certain embodiments, vapor deposited ceramic coatings, e.g., atomic layer deposition, allows the ability to coat both the internal and external surfaces using non-line-of-site methods. Due to the deposition mechanism, the coatings are pin-hole free, resulting in a more uniform coating. In addition, the coatings are thin and highly controlled, allowing minimal disturbance to the aerodynamics and heater performance of certain air data probes. Certain embodiments can improve rain erosion resistance of the coating. Embodiments can provide a coating needed for internal/external surfaces while maintaining erosion resistance. Embodiments can include at least one sulfidation-resistant layer using materials such as but not limited to Platinum (Pt).

Embodiments lower surface roughness and scaling of metal (e.g., nickel) due to oxidation. Embodiments increase heater lifetime due to reduced pitting of the metal sheath. Embodiments can also provide a high temperature resistant coating and/or can be batch coated to lower cost of applying the coating.

Those having ordinary skill in the art understand that any numerical values disclosed herein can be exact values or can be values within a range. Further, any terms of approximation (e.g., "about", "approximately", "around", "substantially") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

Any suitable combination(s) of any disclosed embodiments and/or any suitable portion(s) thereof are contemplated herein as appreciated by those having ordinary skill in the art.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A method, comprising:
   metal plating a metallic layer to at least a portion of a metallic air data probe before applying a first precursor;
   vapor depositing a corrosion resistant coating to internal and external surfaces of the metallic air data probe, wherein vapor depositing includes using chemical vapor deposition (CVD) or atomic layer deposition (ALD) on at least the portion of the metallic air data probe covered by the metallic layer and/or on at least a portion of the metallic air data probe not covered by the metallic layer,
   wherein the corrosion resistant coating is a uniform thickness across the internal and external surfaces of the metallic air data probe, wherein the corrosion resistant coating is or includes a ceramic coating, wherein vapor depositing includes applying the first precursor, then applying a second precursor to the first precursor to form the ceramic coating, wherein applying the first precursor includes applying the first precursor to at least a portion of the metallic layer, wherein the metallic layer includes at least one of platinum, Pd, Ru, or gold having a thickness between about 5 nm to about 20 nm.

2. The method of claim 1, wherein the method includes placing the metallic air data probe in a vacuum chamber and evacuating the vacuum chamber before using vapor deposition.

3. The method of claim 1, wherein the ceramic coating is an oxide.

4. The method of claim 3, wherein the ceramic coating is silicon dioxide ($SiO_2$).

5. The method of claim 4, wherein the first precursor is a reactive, volatile material and the second precursor is an oxide former.

6. The method of claim 3, wherein the ceramic coating is aluminum oxide ($Al_2O_3$).

7. The method of claim 6, wherein the first precursor is triethyl aluminum and the second precursor is an oxide former.

8. The method of claim 7, wherein applying the second precursor includes applying heat simultaneously.

9. The method of claim 3, wherein the ceramic coating is tantalum pentoxide ($Ta_2O_5$) or zirconium oxide.

10. The method of claim 1, wherein the corrosion resistant coating is about 10 nm to about 5 micron thick.

11. The method of claim 1, wherein the metallic air data probe is or includes nickel or nickel alloy.

12. The method of claim 1, wherein the ceramic coating is a nitride.

13. The method of claim 12, wherein the ceramic coating is one of titanium nitride (TiN), titanium aluminum nitride (TiAlN), zirconium nitride, or tantalum nitride (TaN).

14. The method of claim 13, wherein the first precursor includes Titanium chloride and the second precursor includes a nitride former.

15. The method of claim 14, wherein applying the first precursor includes applying heat simultaneously.

* * * * *